United States Patent
Sun et al.

(10) Patent No.: US 11,604,909 B2
(45) Date of Patent: Mar. 14, 2023

(54) SYSTEM AND METHOD FOR ACCELERATED COMPUTATION OF SUBSURFACE REPRESENTATIONS

(71) Applicant: Chevron U.S.A. Inc., San Ramon, CA (US)

(72) Inventors: Tao Sun, Houston, TX (US); Sebastien B. Strebelle, Houston, TX (US); Ashley D. Harris, Houston, TX (US); Maisha Lara Amaru, Houston, TX (US); Lewis Li, Houston, TX (US)

(73) Assignee: Chevron U.S.A. Inc., San Ramon, CA (US)

( * ) Notice: Subject to any disclaimer, the term of this patent is extended or adjusted under 35 U.S.C. 154(b) by 620 days.

(21) Appl. No.: 16/706,596

(22) Filed: Dec. 6, 2019

(65) Prior Publication Data
US 2020/0380390 A1 Dec. 3, 2020

Related U.S. Application Data

(60) Provisional application No. 62/853,530, filed on May 28, 2019.

(51) Int. Cl.
*G01V 99/00* (2009.01)
*G06F 30/27* (2020.01)
(Continued)

(52) U.S. Cl.
CPC ............ *G06F 30/27* (2020.01); *G01V 99/005* (2013.01); *G06N 5/04* (2013.01); *G06N 20/00* (2019.01); *G01V 2210/661* (2013.01)

(58) Field of Classification Search
CPC .................. G06F 30/27; G01V 99/005; G01V 2210/661; G06N 5/04; G06N 20/00
See application file for complete search history.

(56) References Cited

U.S. PATENT DOCUMENTS

| 2,653,220 A | 9/1953 | Bays |
| 7,079,953 B2 | 7/2006 | Thorne |

(Continued)

FOREIGN PATENT DOCUMENTS

| CN | 102540256 | 7/2012 |
| CN | 103454678 | 12/2013 |

(Continued)

OTHER PUBLICATIONS

Edwards, Jonathan, Florent Lallier, Guillaume Caumon, and Cedric Carpentier. "Uncertainty management in stratigraphic well correlation and stratigraphic architectures: A training-based method." (Science Direct, 2018) Computers & Geosciences 111. pp. 1-17. https://doi.org/10.1016/j.cageo.2017.10.008 (Year: 2018).*

(Continued)

*Primary Examiner* — Rehana Perveen
*Assistant Examiner* — Daniel E Miller
(74) *Attorney, Agent, or Firm* — Esplin & Associates, PC

(57) ABSTRACT

A computational stratigraphy model may be run for M mini-steps to simulate changes in a subsurface representation across M mini-steps (from 0-th subsurface representation to M-th subsurface representation), with a mini-step corresponding to a mini-time duration. The subsurface representation after individual steps may be characterized by a set of computational stratigraphy model variables. Some or all of the computational stratigraphy model variables from running of the computational stratigraphy model may be provided as input to a machine learning model. The machine learning model may predict changes to the subsurface representation over a step corresponding to a time duration longer than the mini-time duration and output a predicted subsurface representation. The subsurface representation may be updated based on the predicted subsurface representation outputted by the machine learning model. Running (Continued)

of the computational stratigraphy model and usage of the machine learning model may be iterated until the end of the simulation.

20 Claims, 7 Drawing Sheets

(51) Int. Cl.
   G06N 20/00 (2019.01)
   G06N 5/04 (2023.01)

(56) References Cited

U.S. PATENT DOCUMENTS

| | | | |
|---|---|---|---|
| 7,516,055 B2 | 4/2009 | Strebelle | |
| 7,630,517 B2 | 12/2009 | Mirowski | |
| 7,706,981 B2 | 4/2010 | Wilkinson | |
| 8,271,244 B2 | 9/2012 | Ross | |
| 8,666,149 B2 | 3/2014 | Thorne | |
| 8,954,303 B2* | 2/2015 | Pyrcz | G01V 99/005 703/10 |
| 9,187,984 B2 | 11/2015 | Usadi | |
| 9,753,180 B2 | 9/2017 | Suzuki | |
| 9,804,282 B2 | 10/2017 | Xu | |
| 10,036,829 B2 | 7/2018 | Ghayour | |
| 10,190,403 B2 | 1/2019 | Samuel | |
| 10,287,858 B2 | 5/2019 | Ghayour | |
| 10,317,569 B2 | 6/2019 | Sun | |
| 10,319,143 B2 | 6/2019 | Branets | |
| 10,365,261 B2 | 7/2019 | Montgomery | |
| 10,816,440 B2 | 10/2020 | Amendt | |
| 10,984,590 B1 | 4/2021 | Li | |
| 11,010,969 B1 | 5/2021 | Li | |
| 11,187,826 B2 | 11/2021 | Laugier | |
| 11,249,220 B2 | 2/2022 | Sun | |
| 11,263,362 B2 | 3/2022 | Sun | |
| 11,320,566 B2 | 5/2022 | Hern | |
| 2002/0013687 A1 | 1/2002 | Ortoleva | |
| 2005/0180261 A1 | 8/2005 | Mandal | |
| 2006/0041409 A1 | 2/2006 | Strebelle | |
| 2006/0052938 A1 | 3/2006 | Thorne | |
| 2006/0136162 A1 | 6/2006 | Hamman | |
| 2007/0100593 A1 | 5/2007 | Deffenbaugh | |
| 2007/0219724 A1 | 9/2007 | Li | |
| 2008/0015784 A1 | 1/2008 | Dorn | |
| 2009/0262603 A1 | 10/2009 | Hurley | |
| 2009/0306945 A1 | 12/2009 | Wu | |
| 2009/0319243 A1 | 12/2009 | Suarez-Rivera | |
| 2010/0004864 A1 | 1/2010 | Thorne | |
| 2010/0149917 A1 | 6/2010 | Imhof | |
| 2010/0332205 A1 | 12/2010 | Tillier | |
| 2011/0002194 A1 | 1/2011 | Imhof | |
| 2011/0054857 A1 | 3/2011 | Moguchaya | |
| 2011/0054869 A1 | 3/2011 | Li | |
| 2011/0213600 A1 | 9/2011 | Strebelle | |
| 2011/0231164 A1 | 9/2011 | Zhang | |
| 2011/0240310 A1 | 10/2011 | Sun | |
| 2011/0264430 A1 | 10/2011 | Tapscott | |
| 2011/0272161 A1 | 11/2011 | Kumaran | |
| 2012/0029828 A1 | 2/2012 | Pepper | |
| 2012/0215628 A1 | 8/2012 | Williams | |
| 2012/0221302 A1 | 8/2012 | Lewandowski | |
| 2012/0221306 A1 | 8/2012 | Hurley | |
| 2013/0046524 A1 | 2/2013 | Gathogo | |
| 2013/0064040 A1 | 3/2013 | Imhof | |
| 2013/0118736 A1* | 5/2013 | Usadi | E21B 41/00 166/268 |
| 2013/0151161 A1 | 6/2013 | Imhof | |
| 2013/0179080 A1 | 7/2013 | Skalinski | |
| 2013/0246031 A1 | 9/2013 | Wu | |
| 2013/0294197 A1 | 11/2013 | Vallikkat Thachaparambil | |
| 2013/0318141 A1 | 11/2013 | Maucec | |
| 2013/0329986 A1 | 12/2013 | Strebelle | |
| 2014/0035912 A1 | 2/2014 | Thorne | |
| 2014/0316706 A1 | 10/2014 | Grant | |
| 2014/0358440 A1 | 12/2014 | Pyrcz | |
| 2015/0066460 A1 | 3/2015 | Klinger | |
| 2015/0088424 A1 | 3/2015 | Burlakov | |
| 2015/0112656 A1 | 4/2015 | Rodriguez-Herrera | |
| 2015/0205001 A1 | 7/2015 | Carruthers | |
| 2015/0212231 A1 | 7/2015 | Borouchaki | |
| 2015/0219793 A1 | 8/2015 | Li | |
| 2015/0241591 A1 | 8/2015 | Burmester | |
| 2015/0309197 A1 | 10/2015 | Dimitrov | |
| 2016/0041279 A1 | 2/2016 | Casey | |
| 2016/0048933 A1 | 2/2016 | Strebelle | |
| 2016/0103245 A1 | 4/2016 | Pyrcz | |
| 2016/0139299 A1 | 5/2016 | Leger | |
| 2016/0313463 A1 | 10/2016 | Wahrmund | |
| 2016/0342718 A1 | 11/2016 | Moyner | |
| 2017/0011149 A1 | 1/2017 | Liu | |
| 2017/0153343 A1 | 6/2017 | Almarhoon | |
| 2017/0205531 A1 | 7/2017 | Berard | |
| 2017/0227451 A1 | 8/2017 | Hoegerl | |
| 2018/0003839 A1 | 1/2018 | Lowell | |
| 2018/0217283 A1 | 8/2018 | Klinger | |
| 2018/0225778 A1 | 8/2018 | Grant | |
| 2018/0334902 A1 | 11/2018 | Olsen | |
| 2019/0026405 A1 | 1/2019 | Ramsay | |
| 2019/0094414 A1 | 3/2019 | Prochnow | |
| 2019/0243028 A1 | 8/2019 | Von Gonten | |
| 2020/0308934 A1* | 10/2020 | Li | E21B 49/00 |
| 2021/0048556 A1 | 2/2021 | Sun | |
| 2021/0173117 A1 | 6/2021 | Laugier | |
| 2021/0222523 A1 | 7/2021 | Sun | |
| 2021/0223431 A1 | 7/2021 | Hern | |
| 2021/0302620 A1 | 9/2021 | Hern | |
| 2021/0341642 A1 | 11/2021 | Harris | |

FOREIGN PATENT DOCUMENTS

| | | |
|---|---|---|
| CN | 103454686 | 12/2013 |
| CN | 104111473 | 10/2014 |
| CN | 105372705 | 3/2016 |
| CN | 105717542 | 6/2016 |
| CN | 105954802 | 9/2016 |
| CN | 107942382 | 4/2018 |
| CN | 107976713 | 5/2018 |
| EP | 2917770 | 9/2015 |
| FR | 3039679 | 2/2017 |
| GB | 2474740 | 4/2011 |
| WO | 2017019718 | 2/2017 |
| WO | 2018017108 A1 | 1/2018 |
| WO | 2018208634 | 11/2018 |

OTHER PUBLICATIONS

Véronique Gervais, et. al. "Probability maps of reservoir presence and sensitivity analysis in stratigraphic forward modeling". (HAL, 2018) AAPG Bulletin, American Association of Petroleum Geologists, 2018, 102 (04), pp. 613-628. 10.1306/0913171611517242. hal-01883765 (Year: 2018).*

Ducros, M., et al. "Expert systems and machine learning techniques for effective petroleum system risk assessment and model update". (ResearchGate, 2018) Rio Oil & Gas Conference, Rio de Janeiro, Sep. 2018. accessed online: <ttps://www.researchgate.net/publication/326609988> (Year: 2018).*

Laigle, L., Pierre Joseph, G. De Marsily, and S. Violette. "3-D process modelling of ancient storm-dominated deposits by an event-based approach: application to Pleistocene-to-modern Gulf of Lions deposits." (ScienceDirect, 2013) Marine Geology 335: 177-199. (Year: 2013).*

Hantschel, Thomas, and Armin I. Kauerauf. Fundamentals of basin and petroleum systems modeling. (Springer Science & Business Media, 2009). p. 286. ISBN 978-3-540-72317-2. (Year: 2009).*

Amaru, Maisha, Tao Sun, Lisa Goggin, and Ashley Harris. "Integration of computational stratigraphy models and seismic data for subsurface characterization." The Leading Edge 36, No. 11 (2017): 947a1-947a6 (Year: 2017).

Chandra, Viswasanthi, Patrick William Michael Corbett, Sebastian Geiger, and Hamidreza Hamdi. Improving reservoir characteriza-

(56) References Cited

OTHER PUBLICATIONS tion and simulation with near-wellbore modeling. SPE Reservoir Evaluation & Engineering 16, No. 02 (2013): 183-193 (Year: 2013).
Dalman, Rory AF, and Gert Jan Weltje. SimClast: An aggregated forward stratigraphic model of continental shelves. Computers & geosciences 38, No. 1 (2012): 115-126 (Year: 2012).
Hantschel, Thomas, and Armin I. Kauerauf. Fundamentals of basin and petroleum systems modeling. Section 8.9. Springer Science & Business Media, 2009, pp. 399-404 (Year: 2009).
Hawie, N., M. Callies, and E. Marfisi. "Integrated Multi-Disciplinary Forward Stratigraphic Modelling Workflow in Petroleum Systems Assessment." In SPE Middle East Oil & Gas Show and Conference OnePetro, 2017. 8 pages (Year: 2017).
Michelena, Reinaldo J. et al., "Similarity Analysis: A New Tool to Summarize Seismic Attributes Information", Apr. 1998, TheLeading Edge. (Year: 1998).
PCT International Search Report and Written Opnion for Application No. PCT/US21/29956, dated Aug. 2, 2021 (7 pages).
Weltje, Gert Jan, Rory Dalman, Pantelis Karamitopoulos, and Quinto Sacchi. "Reducing the uncertainty ofstatic reservoir models: implementation of basin-scale geological constraints." In EAGE Annual Conference & Exhibitionincorporating SPE Europec. OnePetro, 2013 (Year: 2013).
Ana-Maria Ilisei et al., Automatic Classification of Subsurface Features in Radar Sounder Data Acquired in Icy Areas, 2013, IEEE, pp. 3530-3533 (Year: 2013).
Efros, A. A., & Freeman, W. T. (2001). Image quilting for texture synthesis and transfer. Proceedings of the 28th Annual Conference on Computer Graphics and Interactive Techniques—SIGGRAPH '01, 341-346. https://doi.org/10.1145/383259.383296.
Hoffimann, J., Scheidt, C., Barfod, A., & Caers, J. (2017). Stochastic simulation by image quilting of process-based geological models. Computers and Geosciences, 106(February), 18-32. https://doi.org/10.1016/j.cageo.2017.05.012.
Mariethoz, G., Renard, P., & Straubhaar, J. (2010). The direct sampling method to perform multiple-point geostatistical simulations. Water Resources Research, 46(11). https://doi.org/10.1029/2008WR007621.
Mahmud, K., Mariethoz, G., Caers, J., Tahmasebi, P., & Baker, A. (2014). Simulation of Earth textures by conditional image quilting. Water Resources Research, 50(4), 3088-3107. https://doi.org/10.1002/2013WR015069.
Bertoncello, Antoine, Caers, Jef, Biver, Pierre, CaumonGuillaume, (2008). Geostatistics on Stratigraphic Grid. ERE department / Stanford University (pp. 1-16).
PCT International Search Report and Written Opinion for Application No. PCT/US21/23008, dated Jun. 8, 2021 (8 pages).
Liu et al. "Visual Analytics of Stratigraphic Correlation for Multi-attribute Well-logging Data Exploration." Jul. 2019 IEEE Access PP(99):1-1, Jul. 16, 2019, [online] [retrieved on Oct. 5, 2020 (Oct. 5, 2020)) Retrieved from the Internet<URL: https://ieeexplore.ieee.org/document/8764395>. entire document (13 pages).
PCT International Search Report and Written Opinion, International Application No. PCT/US20/44874, dated Dec. 17, 2020. (8 pages).
PCT International Search Report and Written Opinion, International Application No. PCT/US20/61212, dated Dec. 21, 2020. (7 pages).
Bourdarot, Gilles, Hocine Khemissa, Abdullah Al Shemsi, Bruno Murat, Remy Richet, Federico Games, and Florent Porcher. "Sedimentology Genetic Modeling of an Offshore Abu Dhabi Carbonate Reservoir." In Abu Dhabi International Petroleum Exhibition and Conference. OnePetro, 2014 (Year: 2014).
Slomka, J. M., K. E. MacCormack, and C. H. Eyles. Preservation of local high-resolution data in a regional low-resolution dataset: a 'nested'3D modeling approach using an example from a Quaternary glacial stratigraphy (Ontario, Canada). Engineering Geology 248 (2019): 309-329 (Year: 2019).
PCT International Search Report and Written Opinion, International Application No. PCT/US2020/61489, dated Jan. 28, 2021 (7 pages).
PCT International Search Report and Written Opinion, International Application No. PCT/US2020/61323, dated Feb. 19, 2021 (8 pages).
PCT International Search Report and Written Opinion, International Application No. PCT/US21/12733, dated Mar. 23, 2021 (11 pages).
Tahmasebi et al. Multiple-point geostatistical modeling based on the cross-correlation 1-15 functions. Mar. 8, 2012 (Mar. 8, 2012). [retrieved on Mar. 5, 2021], Retrieved from the Internet: <URL: http://1www.uwyo.edu/pejman/_files/docs/tahmasebi_ccsim.pdf> pp. 779-796.
Zhou et al. A Stratigraphic Prediction Method Based on Machine Learning. Aug. 29, 2019 1-15 (Aug. 29, 2019). (retrieved on Mar. 5, 2021]. Retrieved from the Internet: <URL: https://www.mdpi.com/2076-3417/9/17/3553/pdf> pp. 1-29.
Zhou et al. A Stratigraphic Prediction Method Based on Machine Learning. Aug. 29, 2019 (Aug. 29, 2019). [retrieved on Mar. 5, 2021]. Retrieved from the Internet: <URL: https://www.mdpi.com/2076-3417/9/17/3553/pdf> pp. 1-29.
Hawie, Nicolas, Jacob Covault, Dallas Dunlap, and Zoltan Sylvester 2017. "Slope-fan Depositional Architecture from High-resolution Forward Stratigraphic Models". EarthArXiv. Dec. 19. eartharxiv.org/f9dkp. (36 pages).
Yupeng, Li, and Wu Shenghe. "Hierarchical nested simulation approach in reservoir architecture modeling." Petroleum Exploration and Development 40, No. 5 (2013): 676-681.
Sacchi, Quinto, Eloisa Salina Borello, Gert Jan Weltje, and Rory Dalman. "Increasing the predictive power of geostatistical reservoir models by integration of geological constraints from stratigraphic forward modeling." Marine and Petroleum Geology 69 (2016): 112-126.
Ou et al. "Fine reservoir structure modeling based upon 3D visualized stratigraphic correlation between horizontal wells: methodology and its application" Journal of Geophysics and Engineering J. Geophys Eng. 14 (2017) 1557-1571 (15pp). (Year: 2017).
PCT International Search Report and Written Opinion, International Application No. PCT/US20/31869, dated Aug. 4, 2020. 2 pages.
Harris S, Santoshini S, Kashem S, Viard T, Levannier A, Benabbou A. Complex geological modeling and quality assurance using unstructured grids. InAbu Dhabi International Petroleum Exhibition & Conference Nov. 12, 2018. Society of Petroleum Engineers. 20 pages.
Rubio, R.H., Koppe, V.C., Costa, J.F.C.L. and Cherchenevski, P.K., 2015. How the use of stratigraphic coordinates improves grade estimation. Rem: Revista Escola de Minas, 68(4), pp. 471-477.
Santoshini S, Harris S, Kashem S, Levannier A, Benabbou A, Viard T, Mace L. Depogrid: Next Generation Unstructured Grids for Accurate Reservoir Modeling and Simulation. InSPE Russian Petroleum Technology Conference Oct. 15, 2018. Society of Petroleum Engineers. 20 pages.
One Petro Search Results, Jun. 15, 2021, 8 pp. (Year: 2021).
Scheevel et al., Principal Component Analysis Applied to 3D Seismic Data for Reservoir Property Estimation, Feb. 1, 2001, SPE Reservoir Evaluation & Engineering 4 (01), pp. 64-72 (Year: 2001).

\* cited by examiner

SYSTEM AND METHOD FOR ACCELERATED COMPUTATION OF SUBSURFACE REPRESENTATIONS

FIELD

The present disclosure relates generally to the field of subsurface representations.

BACKGROUND

A computational stratigraphy model is a physics based forward stratigraphic model that simulates the filling and formation of the sedimentary basins. It simulates the fluid flow and the associated erosion, transport and the deposition of the sediments during the forming of the sedimentary depositional systems. Because most of the hydrocarbon reservoirs are formed in ancient times by these processes, their properties and the key heterogeneities that control the reservoir performances during hydrocarbon exploration and production are all the natural consequences of these depositional processes. By realistically simulating these fluid flow and sedimentation processes, the spatial distribution of the key reservoir properties and heterogeneities can be reproduced. Subsequently, more realistic and more predicative reservoir models are built.

The core component in a computational stratigraphy model is computations of fluid flow and sediment transport. During the computation, at any iteration step in the simulation, fluid flow is first computed given the flow and sedimentary boundary condition and the basin topography at the time step of the computation. Once fluid flow is obtained, sediment transport can then be computed, and the local erosion and/or deposition rate can be solved. Based on the computed erosion and/or deposition rate, the change of the local topography can then be computed using appropriate mass conservation relationships. If there are more materials being eroded than deposited, the topography in the location is lowered. Likewise, if there are more materials being deposited than eroded, the topography in the location is then raised accordingly. In the part of the computation of sediment transport, multiple types and sizes of sediment particles can all be included and consequently, the sorting of sediments can also be obtained. The iteration steps are repeated many times to simulate the natural evolution of the sedimentary system. The change of the topography, the types and sizes of sediments at each location in the entire depositional system are all recorded and are the output of the model.

While a computational stratigraphy model can reproduce highly realistic 3D models of sedimentary depositional systems and thus hydrocarbon reservoirs, it is often computationally intensive and thus expensive. The key fact that limits its speed in the modeling process is the size of the time step the model can take during the computation. Because the model recomputes the flow field at every time step, the size of the time step will have to be small enough so that the computation of the fluid flow is guaranteed to be stable. In the example of depth average or parametrized flow, the limit of the size of the time step the code can take is given by the Courant number, which is well known among the experts in the field of fluid dynamics. For example, in a simulation using a cell size of 10 meters by 10 meters, with water depth of 1.6 meters, and flowing at 1 meter per second, Courant number will limit the iteration time step to be less than approximately 2 seconds. Since topography in a depositional system often changes much slower than the fluid flow, the limit of the time step on the fluid flow computation is the fundamental limit of the computational speed of computational stratigraphy.

A well-known ad-hoc method to get around this limit is the application of so called "morphordynamic factor" (fm) in the model. To make the time step of the model larger, at every time step, or at every predefined time steps, the rate of the change of topography at each (i, j) location in the model is simply multiplied by a given number, e.g. $f_m$=100. That means at that time step, the topography is changed by $$f_m \times \partial \eta / \partial t \times \Delta t$$

where $\partial \eta / \partial t$ is the rate of change of the topography. In that method, the flow field calculation is updated with normal time factor of $\Delta t$ to not exceed the limitations given by Courant number that could lead to numerical instabilities.

Although the method "ad-hoc-ly" accelerates the evolution of the topography by "morphordynamic factor" amount, it has two main shortcomings: 1) it amplifies the noise in the depositional system by "morphordynamic factor" amount; and 2) it exaggerates the aggradation over progradation and retrogradation in the depositional process. The first shortcoming amplifies the noise in the depositional systems because it essentially imprints a time snapshot of the flow field on the depositional features, instead of producing realistic depositional features by integrating of the time varying flow field over, for example, 100 time steps. This shortcoming will lead to models produce unrealistic and very rough and noisy depositional geometries. Consequently, it makes the resulting models useless for building reservoir models. While both shortcomings decrease the fidelity of the model, and both lead to erroneous results, the second shortcoming is even more dangerous as it could also lead to complete wrong predictions of overall evolution trend of the modeled sedimentary systems.

There exists a need for a method that can significantly mitigate the issues with the existing methods, and is able to increase the computational speed and shorten the run time of computational stratigraphy.

SUMMARY

This disclosure relates to accelerated computation of subsurface representations. A computational stratigraphy model may be run for M mini-steps to simulate changes in a subsurface representation across the M mini-steps, with a mini-step corresponding to a mini-time duration. The subsurface representation may change from 0-th subsurface representation to M-th subsurface representation. The subsurface representation after individual steps may be characterized by a set of computational stratigraphy model variables such that running the computational stratigraphy model for M mini-steps results in M sets of computational stratigraphy model variables. At least some of the M sets of computational stratigraphy model variables from running of the computational stratigraphy model may be provided as input to a machine learning model. The machine learning model may predict changes to the subsurface representation over a step and output a predicted subsurface representation, wherein the step corresponds to a time duration longer than the mini-time duration. The subsurface representation may be updated based on the predicted subsurface representation outputted by the machine learning model. Running of the computational stratigraphy model and usage of the machine learning model may be iterated until the end of the simulation.

A system that accelerates computation of subsurface representations may include one or more electronic storage, one or more processors and/or other components. The electronic storage may store information relating to computational stratigraphy models, information relating to subsurface representations, information relating to computational stratigraphy model variables, information relating to machine learning models, information relating to predicted subsurface representations, and/or other information.

The processor(s) may be configured by machine-readable instructions. Executing the machine-readable instructions may cause the processor(s) to facilitate accelerating computation of subsurface representations. The machine-readable instructions may include one or more computer program components. The computer program components may include one or more of a subsurface model component, a machine learning model component, an update component, and/or other computer program components.

The subsurface model component may be configured to run a computational stratigraphy model for M mini-steps to simulate changes in a subsurface representation across the M mini-steps. The subsurface representation may change from a 0-th subsurface representation to a M-th subsurface representation. The subsurface representation after individual mini-steps may be characterized by a set of computational stratigraphy model variables such that running the computational stratigraphy model for M mini-steps results in M sets of computational stratigraphy model variables. An individual mini-step may correspond to a mini-time duration.

In some implementations, the set of computational stratigraphy model variables may include one or more of bottom topography, flow velocity field, flow depth, sediment concentration in flow, grain size composition, sediment transport, and/or other computational stratigraphy model variables. In some implementations, the set of computational stratigraphy model variables may include one or more morphodynamical variables and/or other computational stratigraphy model variables.

The machine learning model component may be configured to provide at least some of the M set of computational stratigraphy model variables as input to one or more machine learning models. A machine learning model may predict changes to the subsurface representation over a step and output a predicted subsurface representation. The predicted subsurface representation may include a prediction of the state of the subsurface representation at the step after the M mini-steps (M mini-steps+step).

The step may correspond to a time duration longer than the mini-time duration corresponding to a mini-step. In some implementations, the changes to the subsurface representation predicted by the machine learning model include total topography change, partial topography change corresponding to individual grain size bin, and/or other changes.

In some implementations, a machine learning model may be trained by using one or more sets of computational stratigraphy model variables as training input to the machine learning model and by using the subsurface representation obtained from running of the computational stratigraphy model as truth to compare training output of the machine learning model. In some implementations, one or more windows may be used to define one or more training portions of the subsurface representation. Multiple training data sets may be generated based on different placements of the window within the subsurface representation.

The update component may be configured to update the subsurface representation based on the predicted subsurface representation outputted by the machine learning model and/or other information. Updating the subsurface representation may include using the predicted subsurface representation outputted by the machine learning model as the subsurface representation after M mini-steps plus the step of the machine learning model (M+L th subsurface representation, where L corresponds to the number of mini-steps covered by the step of the machine learning model). Time in the simulation may be stepped forward by the step of the machine learning model (L mini-steps).

In some implementations, simulation of the changes in the subsurface representation across a simulation time duration may include iteratively changing the subsurface representation by switching between: (1) running of the computational stratigraphy model for a number of mini-steps to simulate changes in the subsurface representation across the number of mini-steps; and (2) updating the subsurface representation based on the predicted subsurface representation outputted by the machine learning model, with at least some of the sets of computational stratigraphy model variables from the running of the computational stratigraphy model for the number of mini steps provided as the input to the machine learning model.

In some implementations, after the subsurface representation is updated based on the predicted subsurface representation outputted by the machine learning model, the computational stratigraphy model may be run for N mini-steps to simulate changes in the subsurface representation across the N mini-steps, with N being larger than M.

In some implementations, the changes to the subsurface representation predicted by the machine learning model may be compared with a vertical resolution. Responsive to the changes to the subsurface representation predicted by the machine learning model exceeding the vertical resolution, a fraction of the changes predicted by the machine learning model may be used to update the subsurface representation.

These and other objects, features, and characteristics of the system and/or method disclosed herein, as well as the methods of operation and functions of the related elements of structure and the combination of parts and economies of manufacture, will become more apparent upon consideration of the following description and the appended claims with reference to the accompanying drawings, all of which form a part of this specification, wherein like reference numerals designate corresponding parts in the various figures. It is to be expressly understood, however, that the drawings are for the purpose of illustration and description only and are not intended as a definition of the limits of the invention. As used in the specification and in the claims, the singular form of "a," "an," and "the" include plural referents unless the context clearly dictates otherwise.

BRIEF DESCRIPTION OF THE DRAWINGS

FIG. 6 illustrates an example process for changing a subsurface representation by iteratively switching between:

(1) running of a subsurface model; and (2) updating the subsurface representation based on a predicted subsurface representation outputted by a machine learning model.

Figure 7:
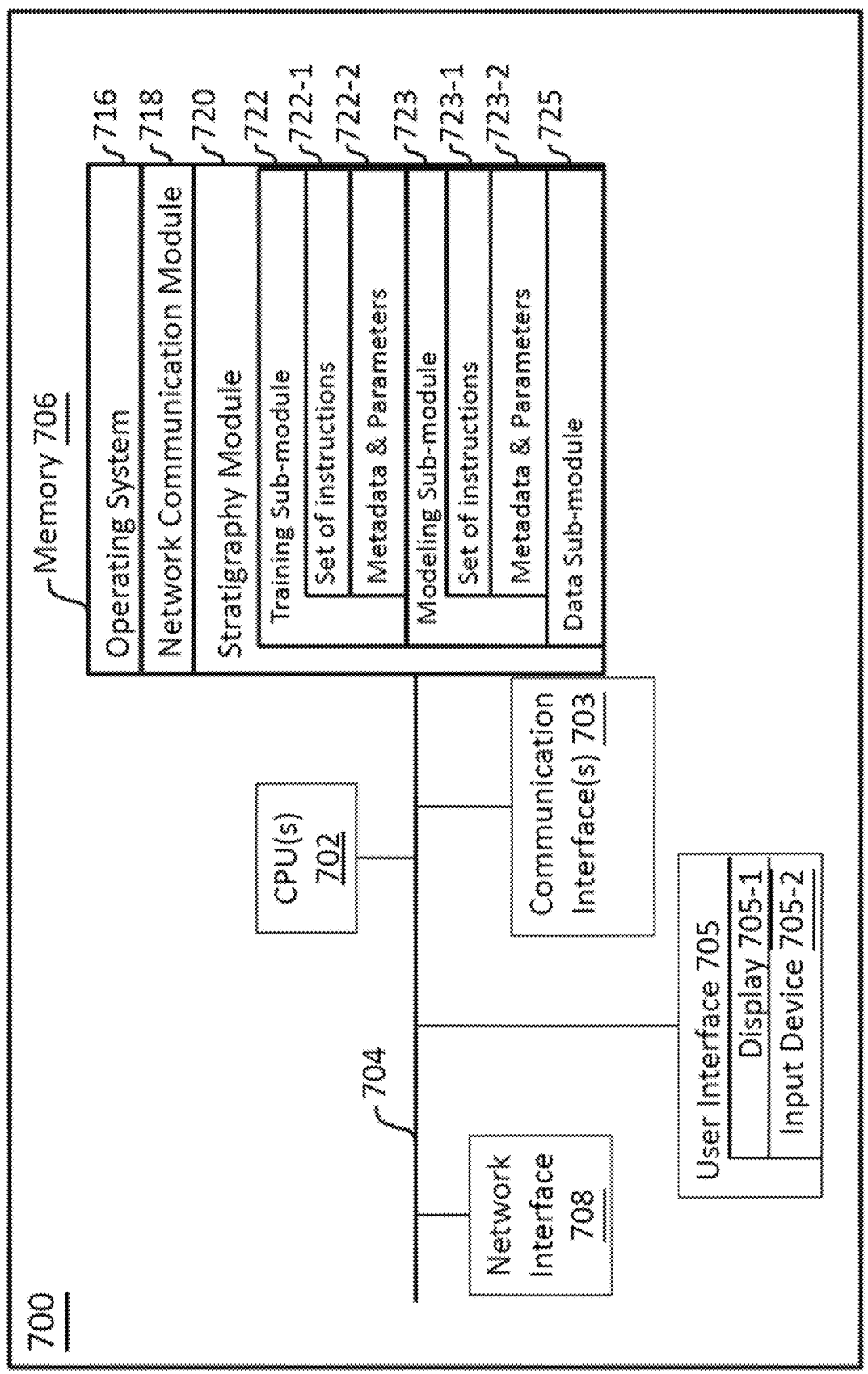

FIG. 7 illustrates an example block diagram illustrating a computational stratigraphy system.

DETAILED DESCRIPTION

The present disclosure relates to accelerated computation of subsurface representations. A computational stratigraphy model may be run for M mini-steps to simulate changes in a subsurface representation across the M mini-steps, with a mini-step corresponding to a mini-time duration. The subsurface representation may change from 0-th subsurface representation to M-th subsurface representation. The subsurface representation after individual steps may be characterized by a set of computational stratigraphy model variables such that running the computational stratigraphy model for M mini-steps results in M sets of computational stratigraphy model variables. At least some of the M sets of computational stratigraphy model variables from running of the computational stratigraphy model may be provided as input to a machine learning model. The machine learning model may predict changes to the subsurface representation over a step and output a predicted subsurface representation, wherein the step corresponds to a time duration longer than the mini-time duration. The subsurface representation may be updated based on the predicted subsurface representation outputted by the machine learning model. Running of the computational stratigraphy model and usage of the machine learning model may be iterated until the end of the simulation.

Figure 1:
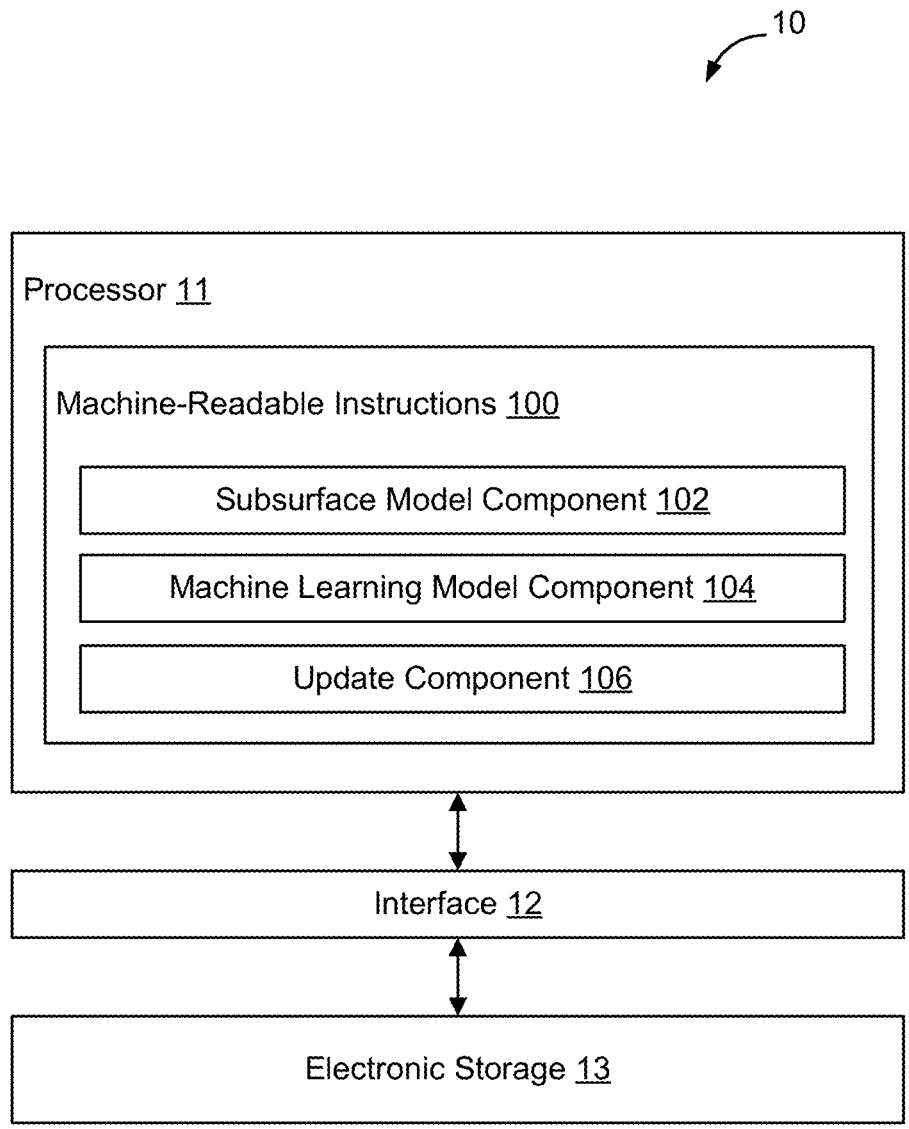
FIG. 1 illustrates an example system that accelerates computation of subsurface representations.

The methods and systems of the present disclosure may be implemented by and/or in a computing system, such as a system 10 shown in FIG. 1. The system 10 may include one or more of a processor 11, an interface 12 (e.g., bus, wireless interface), an electronic storage 13, and/or other components.

The electronic storage 13 may be configured to include electronic storage medium that electronically stores information. The electronic storage 13 may store software algorithms, information determined by the processor 11, information received remotely, and/or other information that enables the system 10 to function properly. For example, the electronic storage 13 may store information relating to computational stratigraphy models, information relating to subsurface representations, information relating to computational stratigraphy model variables, information relating to machine learning models, information relating to predicted subsurface representations, and/or other information.

The processor 11 may be configured to provide information processing capabilities in the system 10. As such, the processor 11 may comprise one or more of a digital processor, an analog processor, a digital circuit designed to process information, a central processing unit, a graphics processing unit, a microcontroller, an analog circuit designed to process information, a state machine, and/or other mechanisms for electronically processing information. The processor 11 may be configured to execute one or more machine-readable instructions 100 to facilitate accelerating computation of subsurface representations. The machine-readable instructions 100 may include one or more computer program components. The machine-readable instructions 100 may include one or more of a subsurface model component 102, a machine learning model component 104, an update component 106, and/or other computer program components.

The subsurface model component 102 may be configured to run one or more subsurface models. A subsurface model may refer to a computer model (e.g., program, tool, script, function, process, algorithm) that simulates subsurface properties. A subsurface property may refer to attribute, quality, and/or characteristics of a region underneath the surface (subsurface region). Examples of subsurface properties simulated by a subsurface model may include types of subsurface materials, characteristics of subsurface materials, compositions of subsurface materials, arrangements/configurations of subsurface materials, physics of subsurface materials, and/or other subsurface properties. A subsurface model may simulate subsurface properties by generating one or more subsurface representations. A subsurface representation may refer to a computer-generated representation of a subsurface region, such as a one-dimensional, two-dimensional and/or three-dimensional model of the subsurface region. A subsurface representation may be defined by and/or include the subsurface properties simulated by the subsurface model.

An example of a subsurface model is a computational stratigraphy model. A computational stratigraphy model may refer to a computer model that simulates depositional and/or stratigraphic processes on a grain size scale while honoring physics-based flow dynamics. A computational stratigraphy model may simulate rock properties, such as velocity and density, based on rock-physics equations and assumptions. Input to a computational stratigraphy model may include information relating to a subsurface region to be simulated. For example, input to a computational stratigraphy model may include paleo basin floor topography, paleo flow and sediment inputs to the basin, and/or other information relating to the basin. In some implementations, input to a computational stratigraphy model may include one or more paleo geologic controls, such as climate changes, sea level changes, tectonics and other allocyclic controls. Output of a computational stratigraphy model may include one or more subsurface properties and/or one or more subsurface representations.

A computational stratigraphy model may include a forward stratigraphic model. A forward stratigraphic model may be fully based on physics of flow and sediment transport. A forward stratigraphic model may simulate one or more sedimentary processes that recreate the way stratigraphic successions develop and/or are preserved. The forward stratigraphic model may be used to numerically reproduce the physical processes that eroded, transported, deposited and/or modified the sediments over variable time periods. In a forward modelling approach, data may not be used as the anchor points for facies interpolation or extrapolation. Rather, data may be used to test and validate the results of the simulation. Stratigraphic forward modelling may be an iterative approach, where input parameters have to be modified until the results are validated by actual data. Usage of other subsurface models are contemplated.

A subsurface model (e.g., computational stratigraphy model, forward stratigraphic model) may be run (e.g., executed) to simulate changes in one or more subsurface representations. A subsurface model may simulate changes in a subsurface representation by successively simulating changes to the subsurface representation over time-steps of the subsurface model. A time-step of a subsurface model may refer to an incremental change in time of the simulation run by the subsurface model. A time-step of a subsurface model may be referred to as a "mini-step." An individual mini-step of a subsurface model may correspond to a duration of time within the simulation. The duration of time corresponding to a mini-step may be referred to as "a mini-time duration." Running a subsurface model for a time-step may result in the time within the simulation changing (e.g., moving forward) by the mini-time duration.

Running a subsurface model over a time-step may generate a new version of the subsurface representation. The new version of the subsurface representation may simulate how the subsurface region would have changed in real time corresponding to the time-step of the subsurface model. Generating a new version of the subsurface representation may include constructing a new subsurface representation and/or changing the prior subsurface representation.

For example, a computational stratigraphy model may be run to generate a subsurface representation. The original subsurface representation (initial state, at starting time of the simulation, at t=0) may be referred to as a 0-th subsurface representation. The computational stratigraphy model may be run for M mini-steps (M representing a number of mini-steps) to simulate changes in the subsurface representation across the M mini-steps. For example, the subsurface representation (subsurface representation corresponding to current time in the simulation) may change from the 0-th subsurface representation to a M-th subsurface representation (e.g., from 0-th subsurface representation to 1-st subsurface representation, . . . to M−1-th subsurface representation, to M-th subsurface representation).

The subsurface representation may be characterized by a set of subsurface model variables and/or other information. A set of surface model variables may include one or more subsurface model variables (one or more values of the subsurface model variable(s)). A subsurface model variable may refer to one or more attributes and/or quantities that describe the nature, features, properties, and/or characteristics of the subsurface representation simulated by a subsurface model. The subsurface model variables and/or values of the subsurface model variables may define the state of the subsurface representation.

For example, a computational stratigraphy model variable may refer to one or more attributes and/or quantities that describe the nature, features, properties, and/or characteristics of the subsurface representation simulated by a computational stratigraphy model. In some implementations, the set of subsurface model variables (e.g., set of computational stratigraphy model variables, set of forward stratigraphic model variables) may include one or more of bottom topography, flow velocity field, flow depth, sediment concentration in flow for individual grain size bin i=1, 2, 3, . . . , n (concentration of individual types and sizes of sediments in flow), grain size composition of the surface and subsurface of the bottom of the flow, sediment transport, and/or other subsurface model variables. In some implementations, the set of subsurface model variables may include one or more morphodynamical variables, such as the bed load flux, the suspended load flux, and the rate of change of the topography $\partial \eta/\partial t$, which may be equal to the sum of the partial rate of the change of the topography corresponding to the grain size bin of i $\partial \eta_i/\partial t$ for all the grain size bins, and/or other subsurface model variables.

The subsurface representation after individual mini-steps may be characterized by separate sets of subsurface model variables (e.g., separate sets of computational stratigraphy model variables, separate sets of forward stratigraphic model variables). For example, the 0-th subsurface representation may be characterized by a 0-th set of subsurface model variables (0-th set of computational stratigraphy model variables, 0-th set of forward stratigraphic model variables), and the 1-st subsurface representation (subsurface representation after one mini-step) may be characterized by a 1-st set of subsurface model variables. Running the subsurface model (e.g., computational stratigraphy model, forward stratigraphic model) for M mini-steps may result in M separate sets of subsurface model variables. One or more values of the subsurface model variables may change between separate/successive sets of subsurface model variables to characterize changes between the corresponding separate/successive subsurface representations. The values of the separate sets of subsurface model variables may define the states of the subsurface representation after individual mini-steps.

Figure 3:
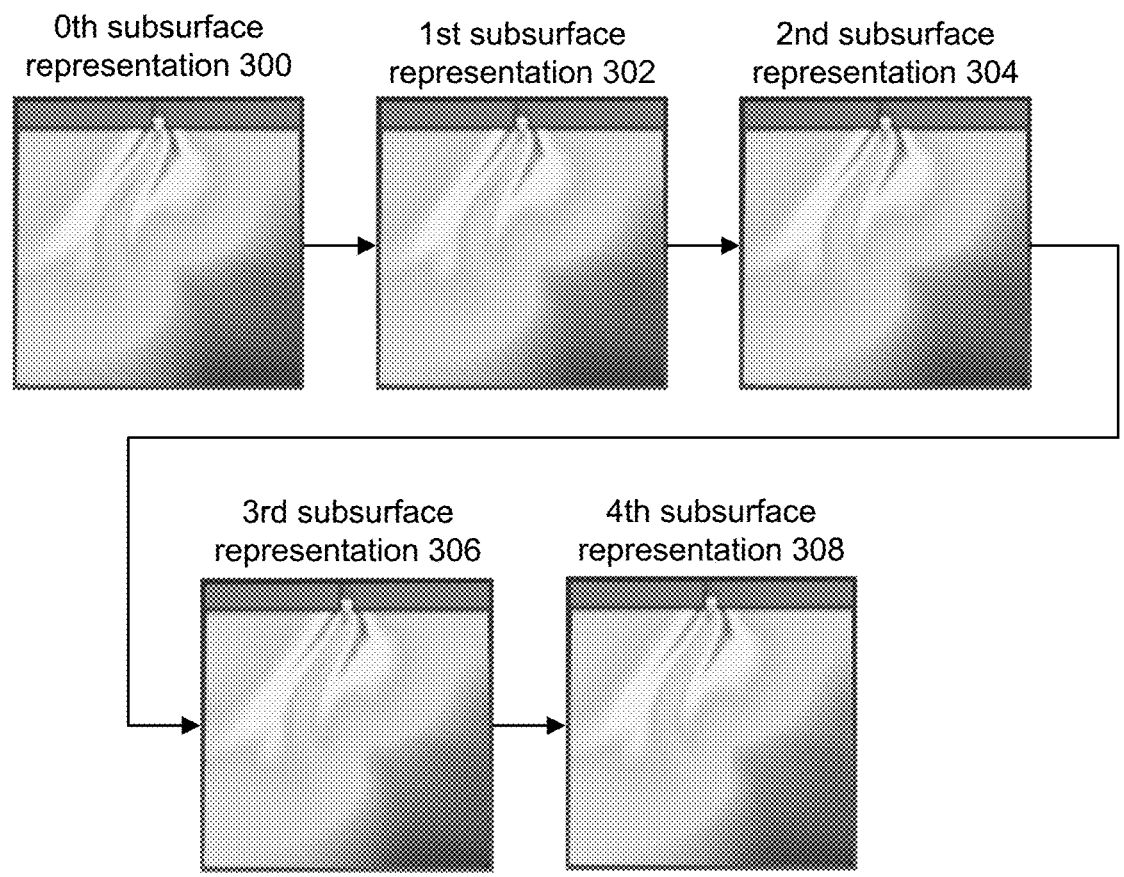
FIG. 3 illustrates example changes in a subsurface representation simulated by a subsurface model.

FIG. 3 illustrates example changes in a subsurface representation simulated by a subsurface model (e.g., computational stratigraphy model, forward stratigraphic model)). The versions of the subsurface representation shown in FIG. 3 may be result of physics and/or other calculations performed by the subsurface model. The versions of the subsurface representation shown in FIG. 3 may include a portion of the subsurface representation within a window. The changes shown in FIG. 3 may correspond to changes simulated by running the subsurface model over four mini-steps. The subsurface representation may change from a 0th subsurface representation 300 to a 1st subsurface representation 302 (after 1st mini-step in the simulation), from the 1st subsurface representation 302 to a 2nd subsurface representation 304 (after 2nd mini-step in the simulation), from the second subsurface representation 304 to a 3rd subsurface representation 306 (after 3rd mini-step in the simulation), and from the 3rd subsurface representation 306 to a 4th subsurface representation 308 (after 4th mini-step in the simulation). The changes in the subsurface representation between individual mini-steps may be shown by differences in shading of different versions of the subsurface representation.

The speed with which a subsurface model may be run may be restricted by limitation on the size of time-steps (mini-step) taken by the subsurface model. A simulation of a subsurface region by a subsurface model may require calculations, such as fluid dynamic calculations and transformation, at individual time-steps. The size of the time-steps for fluid dynamic calculations may be limited by relevant hydrodynamic conditions, such as the Courant number. Using a time-step larger than this limit may result in inaccurate calculations and inaccurate simulation results. Thus, the incremental steps (mini-steps) by which simulation may be run may be restricted, which in turn limits the speed with which changes in time may be simulated by subsurface models.

To overcome these deficiencies, the approaches disclosed herein leverage predictive capabilities of machine learning models to take steps having sizes larger than the restricted size of mini-steps of the subsurface model. The approaches disclosed herein utilizes results of running a subsurface model for a number of mini-steps (e.g., M-mini steps) as input to one or more machine learning models. Running of the subsurface model for a number of mini-steps may provide information on how the subsurface representations are changing across the mini-steps (e.g., how sediment transport is changing, how morphological changes are being made). Such information may be used by the machine learning model to predict how the subsurface representation will look after a large step (larger than restricted size of mini-step limited by Courant number). By interleaving running of subsurface model and using predictions outputted by the machine learning model, the computation of subsurface representations may be accelerated.

The machine learning model component 104 may be configured to provide one or more sets of surface model variables to one or more machine learning models. For example, the subsurface model (e.g., computational stratigraphy model, forward stratigraphic model) may be run for M mini-steps, resulting in M separate sets of subsurface model variables. The machine learning model component 104 may provide at least some of the M set of computational stratigraphy model variables as input to the machine learning model(s). That is, the machine learning model component 104 may provide some or all of the M set of computational stratigraphy model variables as input to the machine learning model(s). Such provision of the computational stratigraphy model variables may effectuate provision of different states of the subsurface representation as input to the machine learning model(s).

A machine learning model may refer to a model created using machine learning. A machine learning model generate (output) one or more predictions based on patterns extracted from the input to the machine learning model. A machine learning model may be trained using one or more training data sets. Training of the machine learning model using the training data set(s) may change the configuration of the machine learning model. For example, a machine learning model may include one or more neural networks, and training of the machine learning model may change weights of neurons, layers, and/or interconnections to alter the importance of different types of input. Usage of different/different combinations of machine learning models (e.g., neural networks, convolutional neural networks, deep learning network) are contemplated.

Providing a set of surface model variables to a machine learning model may include providing the values of different surface model variables included within the set of surface model variables. The number of sets of surface model variables provided to a machine learning model may depend on the number of mini-steps that were run on the subsurface model. The maximum number of sets of subsurface model variables provided to a machine learning model may be limited by the continuous number of mini-steps that were run on the subsurface model. For example, the subsurface model may be run for 10 mini-steps to simulate changes in the subsurface representation across the 10 mini-steps. The machine learning model component 104 may provide up to 10 sets of surface model variables to be used as input to a machine learning model.

The number of sets of surface model variables provided to a machine learning model may depend on and/or correspond to the number of sets of surface model variables used to train the machine learning model. For instance, for a machine learning model trained using 5 sets of surface model variables as input, the machine learning model component 104 may provide 5 sets of surface model variables as input to the machine learning model.

The sets of surface model variables provided to a machine learning model may include adjacent sets of surface model variables and/or non-adjacent sets of surface model variables. Adjacent sets of surface model variables may refer to sets of surface model variables that define adjacent states of surface representations. For example, adjacent sets of surface model variables may include sets of surface model variables for the 0-th subsurface representation, the 1-st subsurface representation, the 2-nd subsurface representation, and so forth. Non-adjacent sets of surface model variables may refer to sets of surface model variables that define non-adjacent states of surface representations. For example, non-adjacent sets of surface model variables may include sets of surface model variables for the 0-th subsurface representation, the 1000-th subsurface representation, the 1020-th subsurface representation, and/or other versions of subsurface representation. The non-adjacent sets of surface model variables may include sets of surface model variables for evenly spaced apart versions of subsurface representation (e.g., every fifth version of subsurface representation) and/or non-evenly spaced apart versions of subsurface representation.

The sequence of sets of surface model variables selected for provision to a machine learning model may depend on and/or correspond to the sequence of sets of surface model variables used to train the machine learning model. For instance, for a machine learning model trained using a sequence of 1st, 2nd, 3rd, 1000th, 1100th, and 1101th sets of surface model variables, the machine learning model component 104 may provide 1st, 2nd, 3rd, 1000th, 1100th, and 1101th sets of surface model variables from the M-sets subsurface model variables as input to the machine learning model.

A machine learning model may predict changes to the subsurface representation over a step and output a predicted subsurface representation based on the input provided by the machine learning model component 104 and/or other information. Input provided by the machine learning model component 104 may be directly inputted into the machine learning model and/or transformed into/used to generate the actual input to the machine learning model. The step of the machine learning model may correspond to a time duration longer than the mini-time duration corresponding to the mini-step of the subsurface model. In some implementations, the time duration of the machine learning model may correspond to integer-multiple or non-integer multiple of the mini-time duration. For example, individual mini-steps of the simulation performed by the subsurface model may correspond to m time duration, and the step of the machine learning model may correspond to 2 times m, 100 times m, 1000 times m, or other multiples of m. The number of mini-steps within the step of the machine learning model may be represented as L.

The predicted subsurface representation may include a prediction of the state of the subsurface representation at the step after the last mini-step run by the subsurface model. The predicted subsurface representation may include a predicted version of the subsurface representation that would have been obtained by running the subsurface model had the subsurface model been run for L additional mini-steps.

Individual mini-steps run by the subsurface model may advance the time of the simulation by the mini-time duration (m). For example, running of the subsurface model for M-mini steps may result in the time of the simulation advancing by M times m, such as from t=0 to t=M×m, and generation of the M-th surface representation. The M-th surface representation may be the subsurface representation after M-th iteration of running the subsurface model by mini-steps. The predicted subsurface representation may include a prediction of the surface representation at time in the simulation t=M×m+L×m. The predicted subsurface representation may include a prediction of the (M+L)th surface representation. The predicted surface representation may include a prediction of the surface representation after the (M+L)th iteration of running the subsurface model by mini-steps. Thus, the machine learning model may be used to predict changes to the subsurface model over a larger step than allowed/feasible for the subsurface model.

In some implementations, the changes to the subsurface representation predicted by the machine learning model include total topography change, partial topography change corresponding to individual grain size bin, and/or other changes. Partial topography change may reflect changes in topography based on grains of particular sizes (e.g., topography change due to different transportation and/or rates of deposition of differently sized grains). Total topography change may be equal to the sum of all partial topography change.

In some implementations, a machine learning model may be trained by using one or more sets of subsurface model variables (e.g., values of computational stratigraphy model variables, values of forward stratigraphic model variables) as training input to the machine learning model and by using the subsurface representation obtained from running of the subsurface model (e.g., computational stratigraphy model, forward stratigraphic model) as truth to compare training output of the machine learning model. The subsurface model variables may be used for input to the machine learning model during training (training input) and the output of the machine learning model during training (training input) may be compared to a subsurface representation simulated by the subsurface model to adjust the machine learning model. In some implementations, online training may be performed to perform additional training of the machine learning model. For instance, data gathered while iteratively using the subsurface model and the machine learning model to generate subsurface representation may be used to update the training of the machine learning model.

In some implementations, one or more windows may be used to define one or more training portions of the subsurface representation. A window may determine which parts of the subsurface representation are used to train a machine learning model. Using a window that covers the entire subsurface representation may result in subsurface model variables for the entire subsurface representation being used to train the machine learning model. A window that covers a part of the subsurface representation may result in subsurface model variables for the part of the subsurface representation being used to train the machine learning model. That is, the input to the machine learning model may be the portions of the subsurface model variables that characterize/define the part of the subsurface representation within the window. In some implementations, multiple training data sets may be generated based on different placements of the window(s) within the subsurface representation. For example, a training data set may be generated to include one portion of the subsurface model variables by placing a window to cover one part of the subsurface representation and another training data set may be generated to another portion of the subsurface model variables by placing the window to cover another part of the subsurface representation. For instance, a window may be moved over different parts of the subsurface representation and/or multiple windows may be placed in different parts of the subsurface representation to generate multiple training data sets for the machine learning model.

Figure 4:
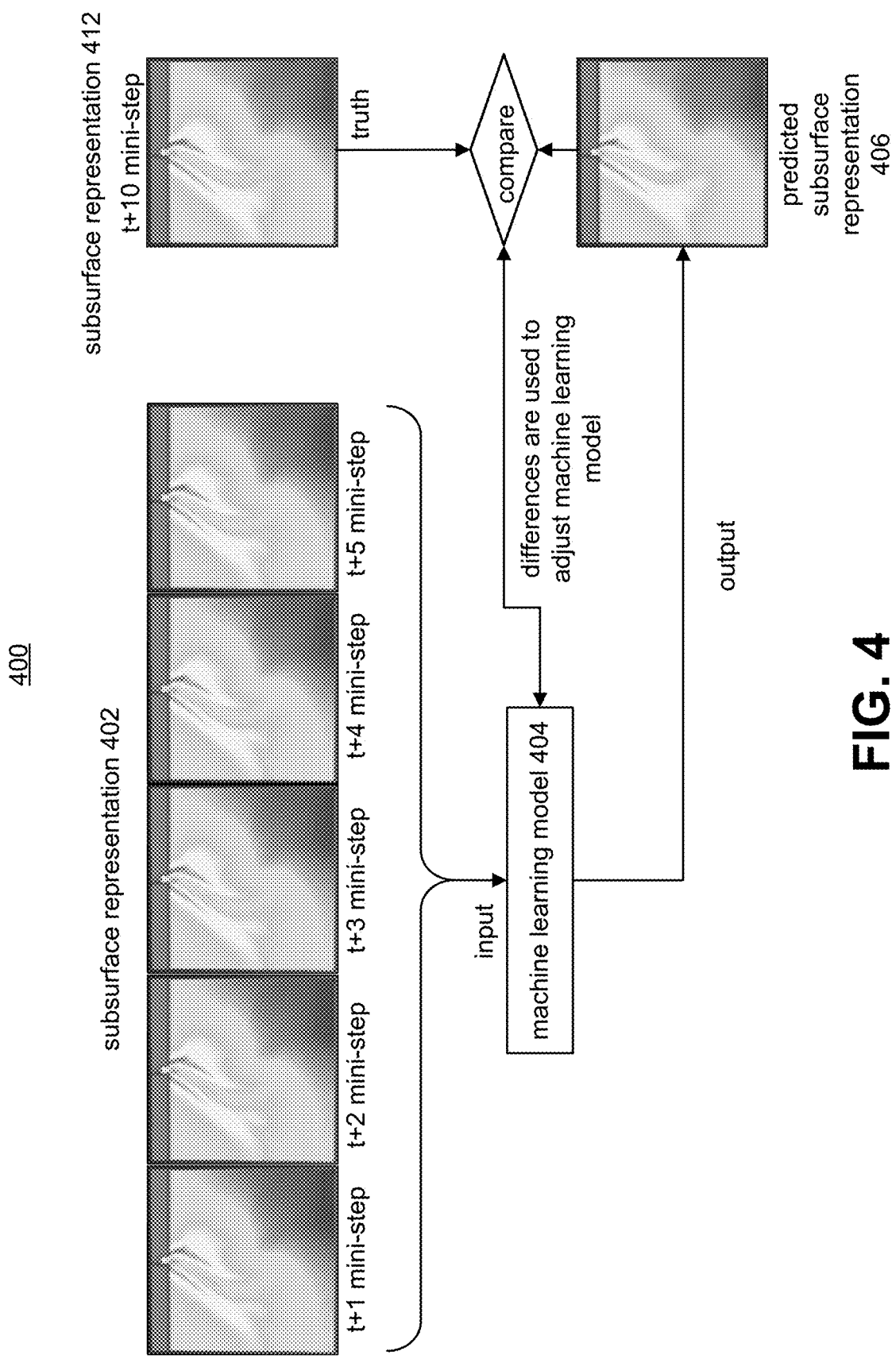
FIG. 4 illustrates an example process of training a machine learning model to accelerate computation of subsurface representations.

FIG. 4 illustrates an example process 400 of training a machine learning model to accelerate computation of subsurface representations. The process 400 may include running of a subsurface model for a number of mini-steps. At every mini-step, the state of the subsurface representation (e.g., values of subsurface model variables) may be stored in memory. At iteration step k, the state of the subsurface model from previous m iterations may be provided as input to a machine leaning model. For instance, in FIG. 4, the subsurface model may be run for five or more mini-steps to generate five or more versions of subsurface representation 402. The state of the subsurface representation for the 5 previous mini-steps (from t+1 mini-step to t+5 mini-steps) may be used to provide input to a machine learning model 404. Entire state or one or more portions of the state (using one or more windows) of the subsurface representation 402 may be used to provide input to the machine-learning model 404.

Based on the input, the machine learning model 404 may output a predicted surface representation 406. The predicted surface representation 406 may be a prediction of the state of the subsurface representation at step k+L. For example, in FIG. 4, L may equal 5 and the predicted surface representation 406 be a prediction of the state of the subsurface representation at t+10 mini-steps.

The subsurface model may be run through k+L mini-steps to obtain subsurface representation 412, the actual state of the subsurface representation at step k+L. The total topography change from iteration step k to iteration step k+L may be obtained by subtracting the topography at step k from the topography at step k+L. The partial topography change corresponding to individual grain size bin i may be obtained by summing over the partial thickness in the recorded stratigraphy from the topography at step k to the topography at step k+L.

The subsurface representation 412 may be used as truth to compare the output of the machine learning model 404 (the predicted subsurface representation 406). Window(s) used to provide the input to the machine-learning model 404 may be used (e.g., applying window with same size and same location) to determine which portion of the subsurface representation 412 will be compared to the output of the machine learning model 404 and to determine which subsurface model variables will be used as expected output of the machine learning model 404. The difference between the output of the machine learning model 404 and the truth/expected output obtained from running the subsurface model may be used to train the machine learning model 404.

In some implementations, one or more windows may be moved to different location in the subsurface representation to provide multiple training data sets. In some implementations, different number of k and/or L may be used to generate multiple training data sets. In some implementations, rather than using a certain number of last consecutive preceding states, a particular sequence of preceding states may be used as input to the machine learning model 404. In some implementations, the simulation may be run for depositional systems in different depositional environments to train different machine learning models for different environment of depositions or sub-environment of depositions. In some implementations, one machine learning model may be trained with data from multiple environments of depositions or multiple sub-environments of depositions.

The update component 106 may be configured to update the subsurface representation based on the predicted subsurface representation outputted by the machine learning model and/or other information. Updating the subsurface representation may include updating the topography and/or the stratigraphy of the subsurface representation based on the predicted subsurface representation outputted by the machine learning model. Updating the subsurface representation may include using the predicted subsurface representation outputted by the machine learning model as the subsurface representation for the time in the simulation corresponding to the last mini-step in running the subsurface model plus the step corresponding to the machine-learning model. For example, the subsurface model may have been run for M mini-steps, and updating the subsurface representation may include using the predicted subsurface representation outputted by the machine learning model as the subsurface representation after M mini-steps plus the step of the machine learning model. The predicted subsurface representation outputted by the machine learning model may be used as the (M+L)th subsurface representation, where L corresponds to the number of mini-steps covered by the step of the machine learning model. Time in the simulation may be stepped forward by the step of the machine learning model (L mini-steps). That is, the time in the simulation will be jumped forward in time by the time duration (corresponding to the step) of the machine-learning model. Thus, the simulation of the subsurface representation may jump from the M-th step to the (M+L)th step by using the predicted subsurface representation outputted by the machine learning model.

In some implementations, simulation of the changes in the subsurface representation across a simulation time duration may include iteratively changing the subsurface representation by switching between: (1) running of a subsurface model for a number of mini-steps to simulate changes in the subsurface representation across the number of mini-steps; and (2) updating the subsurface representation based on the predicted subsurface representation outputted by a machine learning model, with at least some of the sets of subsurface model variables from running of the subsurface model for the number of mini steps provided as input to the machine learning model. The simulation of the subsurface representation may proceed by iteratively using the subsurface model to simulate changes to the subsurface representation over small time steps and by using the machine learning model to simulate changes to the subsurface representation over a large time step.

Figure 5:
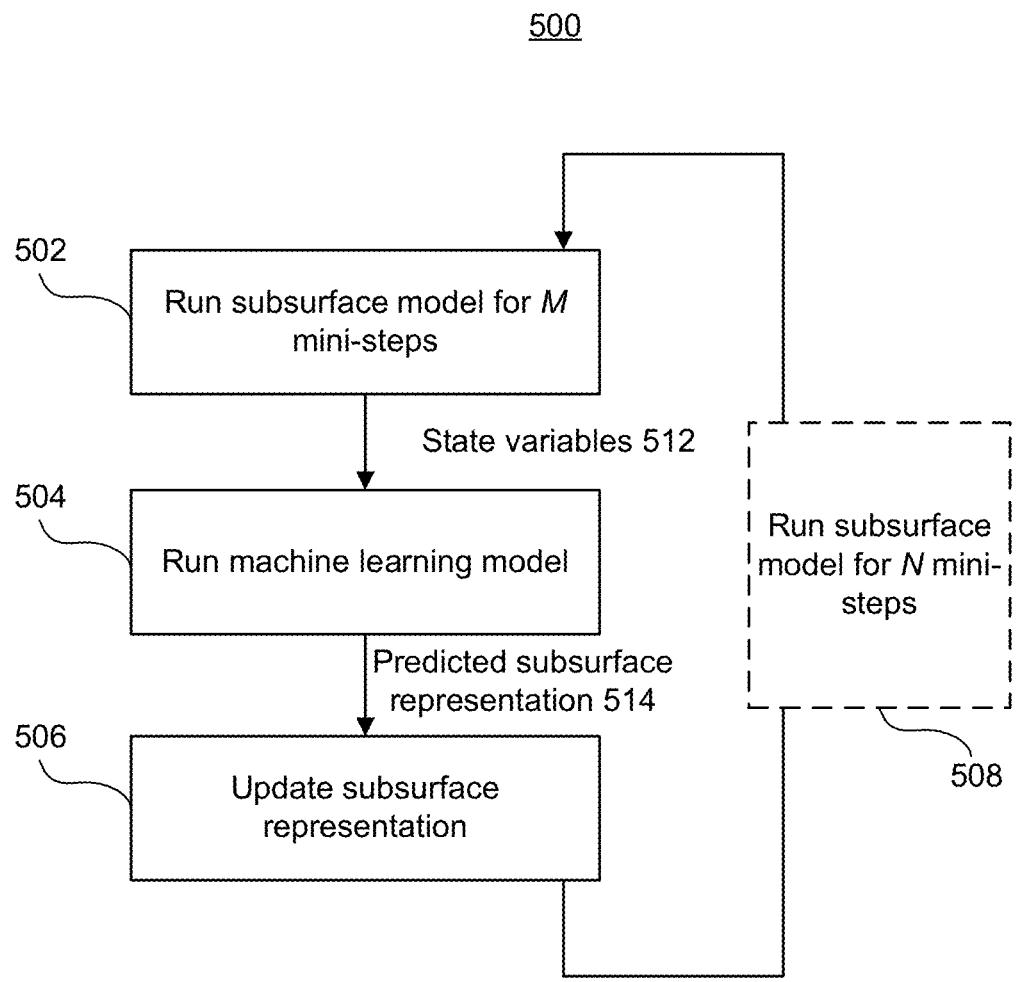
FIG. 5 illustrates an example iterative process for using a machine learning model to accelerate computation of subsurface representations.

FIG. 5 illustrates an example iterative process 500 for using a machine learning model to accelerate computation of subsurface representations. At step 502, a subsurface model (e.g., computational stratigraphy model, forward stratigraphic model) may be run for M mini-steps. State variables 512 from some or all of the M versions of the subsurface representations may be used as input to a machine learning model. At step 504, the machine learning model may be run to obtain a predicted subsurface representation 514. The predicted subsurface representation 514 may include a predicted of a predicted version of the subsurface representation that would be have been obtained by running the subsurface model had the subsurface model been run for L additional mini-steps. At step 506, the subsurface representation may be updated with the predicted subsurface representation 514 and the time in the simulation may be advanced by duration corresponding to L mini-steps. The process 500 may return to the step 502 to restart the process. Thus, usage of the machine-learning model may be interleaved with running of the subsurface model to enable simulation of changes in the subsurface representation at steps greater than mini-step of the subsurface model. The process 500 may be repeated until the end of the simulation is reached.

In some implementations, after the subsurface representation is updated based on the predicted subsurface representation outputted by the machine learning model, the subsurface model may be run for N mini-steps to simulate changes in the subsurface representation across the N mini-steps, with N being larger than M. N may be much smaller than L. For example, referring to FIG. 5, after the step 506, the process 500 may continue to step 508 rather than returning to the step 502. Running the subsurface model for N mini-steps may result in greater number of subsurface representation changes/versions of subsurface representation being generated by the subsurface model than without the step 508.

After the step 508, the process 500 may return to the 502 to restart the process. Alternatively, the process 500 may skip the step 502 after the step 508, and proceed to the step 504. In skipping the step 502, the process 500 may use obtain state variables 512 from some of the N versions of the subsurface representations generated in the step 508.

Figure 6:
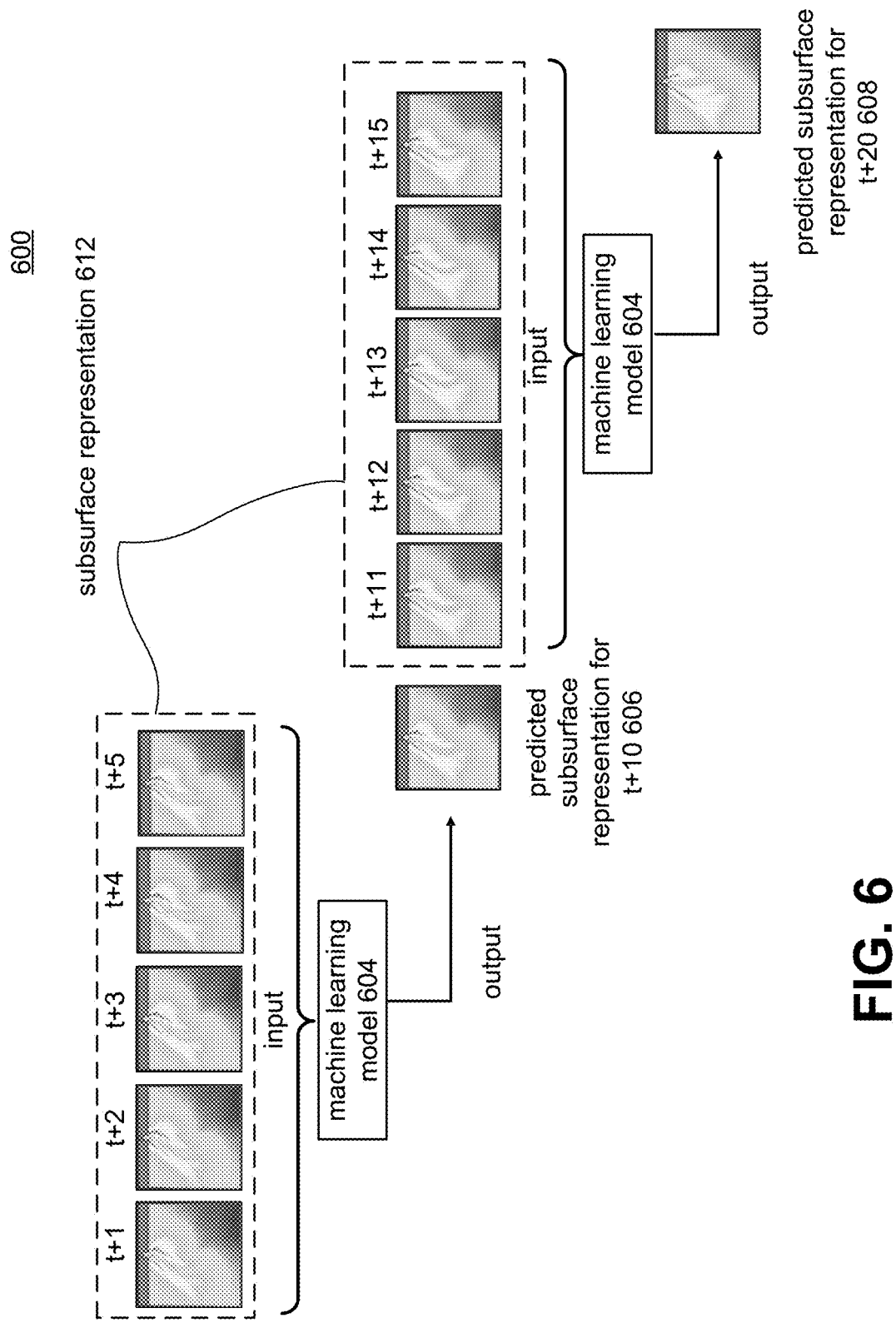

FIG. 6 illustrates an example process 600 for changing a subsurface representation by iteratively switching between: (1) running of a subsurface model; and (2) updating the subsurface representation based on a predicted subsurface representation outputted by a machine learning model. The process 600 may begin by running the subsurface model to generate five versions of the subsurface representation 602. The state of the subsurface representation 602 for the 5 previous mini-steps (from t+1 to t+5) may be used to provide input to a machine learning model 604. Entire state or one or more portions of the state (using one or more windows) of the subsurface representation 612 may be used to provide input to the machine-learning model 604. Based on the input, the machine learning model 604 may output a predicted surface representation 606, with the predicted surface representation including prediction of changes over a step L=5. The predicted surface representation 606 may be a prediction of the state of the subsurface representation at t+10. The subsurface representation in the simulation may be updated with the predicted surface representation 606 and the time of the simulation may be stepped forward by time corresponding to 5 mini-steps (to t+10).

The process 600 may continue by running the subsurface model to generate additional five versions of the subsurface representation 602, with the version of the subsurface representation generated at t+11 representing a mini-step change from the predicted surface representation 606. The state of the subsurface representation 602 for the 5 previous mini-steps (from t+11 to t+15) may be used to provide input to the machine learning model 604. Based on the input, the machine learning model 604 may output a predicted surface representation 608, with the predicted surface representation including prediction of changes over a step L=5. The predicted surface representation 608 may be a prediction of the state of the subsurface representation at t+20. The subsurface representation in the simulation may be updated with the predicted surface representation 608 and the time of the simulation may be stepped forward by time corresponding to 5 mini-steps (to t+20). Running of the subsurface model; and updating the subsurface representation based on a predicted subsurface representation outputted by the machine learning model may be repeated until the end of the simulation is reached.

In some implementations, the changes to the subsurface representation predicted by the machine learning model may be compared with a vertical resolution for the stratigraphy of the modeling system. Responsive to the changes to the subsurface representation predicted by the machine learning model exceeding the vertical resolution, a fraction of the changes predicted by the machine learning model may be used to update the subsurface representation. A fraction of the changes predicted by the machine-learning model may be used to update the subsurface representation so that the maximum change of the total topography is same or less than the vertical resolution.

The vertical resolution may restrict the extent to which changes to the subsurface representation predicted by the machine learning model may be incorporated (e.g., updated)

into the simulation. Such restriction on changes to the subsurface representation may enable control over the accuracy of the modeling system that integrates subsurface model and machine learning model.

The vertical resolution may refer to the maximum height of the subsurface representation to be allowed within the simulation and/or the maximum change in height of the subsurface representation to be allowed using changes predicted by the machine learning model. The value(s) of the vertical resolution may be set or determined based on default (e.g., system/program/application default), user selection (e.g., user selection of the vertical resolution), information relating to the subsurface model, information relating to the subsurface representation, information relating to the machine learning model, and/or other information.

For example, the vertical resolution may refer to the maximum height of the subsurface representation to be allowed within the simulation and the changes to the subsurface representation predicted by the machine learning model may include the predicted subsurface representation outputted by the machine learning model. Based on the height of the predicted subsurface representation being greater than the vertical resolution, a fraction of the changes predicted by the machine-learning model may be used to update the subsurface representation.

As another example, the vertical resolution may refer to the maximum change in height of the subsurface representation to be allowed using changes predicted by the machine learning model and the changes to the subsurface representation predicted by the machine learning model may include the height difference between the predicted subsurface representation outputted by the machine learning model and the last (most recent, current) version of the subsurface representation generated from running the subsurface model. Based on the height difference being greater than the vertical resolution, a fraction of the changes predicted by the machine-learning model may be used to update the subsurface representation.

In some implementations, using a fraction of the changes predicted by the machine-learning model to update the subsurface representation may include using a fraction of the time step of the machine learning model (e.g., a fraction of L) when the topography and the stratigraphy of the subsurface representation is updated. In some implementations, using a fraction of the changes predicted by the machine-learning model to update the subsurface representation may include modifying the predicted subsurface representation outputted by the machine learning model reflect change in subsurface representation over a fraction of the time step. In some implementations, using a fraction of the changes predicted by the machine-learning model to update the subsurface representation may include generating a new predicted subsurface representation for the fraction of the time step. The new predicted subsurface representation for the fraction of the time step may be generated by modifying the machine learning model to configured for the fraction of the time step or by using another machine learning model trained to output prediction over the fraction of the time step.

Implementations of the disclosure may be made in hardware, firmware, software, or any suitable combination thereof. Aspects of the disclosure may be implemented as instructions stored on a machine-readable medium, which may be read and executed by one or more processors. A machine-readable medium may include any mechanism for storing or transmitting information in a form readable by a machine (e.g., a computing device). For example, a tangible computer-readable storage medium may include read-only memory, random access memory, magnetic disk storage media, optical storage media, flash memory devices, and others, and a machine-readable transmission media may include forms of propagated signals, such as carrier waves, infrared signals, digital signals, and others. Firmware, software, routines, or instructions may be described herein in terms of specific exemplary aspects and implementations of the disclosure, and performing certain actions.

In some implementations, some or all of the functionalities attributed herein to the system 10 may be provided by external resources not included in the system 10. External resources may include hosts/sources of information, computing, and/or processing and/or other providers of information, computing, and/or processing outside of the system 10.

Although the processor 11 and the electronic storage 13 are shown to be connected to the interface 12 in FIG. 1, any communication medium may be used to facilitate interaction between any components of the system 10. One or more components of the system 10 may communicate with each other through hard-wired communication, wireless communication, or both. For example, one or more components of the system 10 may communicate with each other through a network. For example, the processor 11 may wirelessly communicate with the electronic storage 13. By way of non-limiting example, wireless communication may include one or more of radio communication, Bluetooth communication, Wi-Fi communication, cellular communication, infrared communication, or other wireless communication. Other types of communications are contemplated by the present disclosure.

Although the processor 11 is shown in FIG. 1 as a single entity, this is for illustrative purposes only. In some implementations, the processor 11 may comprise a plurality of processing units. These processing units may be physically located within the same device, or the processor 11 may represent processing functionality of a plurality of devices operating in coordination. The processor 11 may be separate from and/or be part of one or more components of the system 10. The processor 11 may be configured to execute one or more components by software; hardware; firmware; some combination of software, hardware, and/or firmware; and/or other mechanisms for configuring processing capabilities on the processor 11.

It should be appreciated that although computer program components are illustrated in FIG. 1 as being co-located within a single processing unit, one or more of computer program components may be located remotely from the other computer program components. While computer program components are described as performing or being configured to perform operations, computer program components may comprise instructions which may program processor 11 and/or system 10 to perform the operation.

While computer program components are described herein as being implemented via processor 11 through machine-readable instructions 100, this is merely for ease of reference and is not meant to be limiting. In some implementations, one or more functions of computer program components described herein may be implemented via hardware (e.g., dedicated chip, field-programmable gate array) rather than software. One or more functions of computer program components described herein may be software-implemented, hardware-implemented, or software and hardware-implemented The description of the functionality provided by the different computer program components described herein is for illustrative purposes, and is not intended to be limiting, as any of computer program components may provide more or less functionality than is described. For example, one or more of computer program components may be eliminated, and some or all of its functionality may be provided by other computer program components. As another example, processor 11 may be configured to execute one or more additional computer program components that may perform some or all of the functionality attributed to one or more of computer program components described herein.

The electronic storage media of the electronic storage 13 may be provided integrally (i.e., substantially non-removable) with one or more components of the system 10 and/or as removable storage that is connectable to one or more components of the system 10 via, for example, a port (e.g., a USB port, a Firewire port, etc.) or a drive (e.g., a disk drive, etc.). The electronic storage 13 may include one or more of optically readable storage media (e.g., optical disks, etc.), magnetically readable storage media (e.g., magnetic tape, magnetic hard drive, floppy drive, etc.), electrical charge-based storage media (e.g., EPROM, EEPROM, RAM, etc.), solid-state storage media (e.g., flash drive, etc.), and/or other electronically readable storage media. The electronic storage 13 may be a separate component within the system 10, or the electronic storage 13 may be provided integrally with one or more other components of the system 10 (e.g., the processor 11). Although the electronic storage 13 is shown in FIG. 1 as a single entity, this is for illustrative purposes only. In some implementations, the electronic storage 13 may comprise a plurality of storage units. These storage units may be physically located within the same device, or the electronic storage 13 may represent storage functionality of a plurality of devices operating in coordination.

Figure 2:
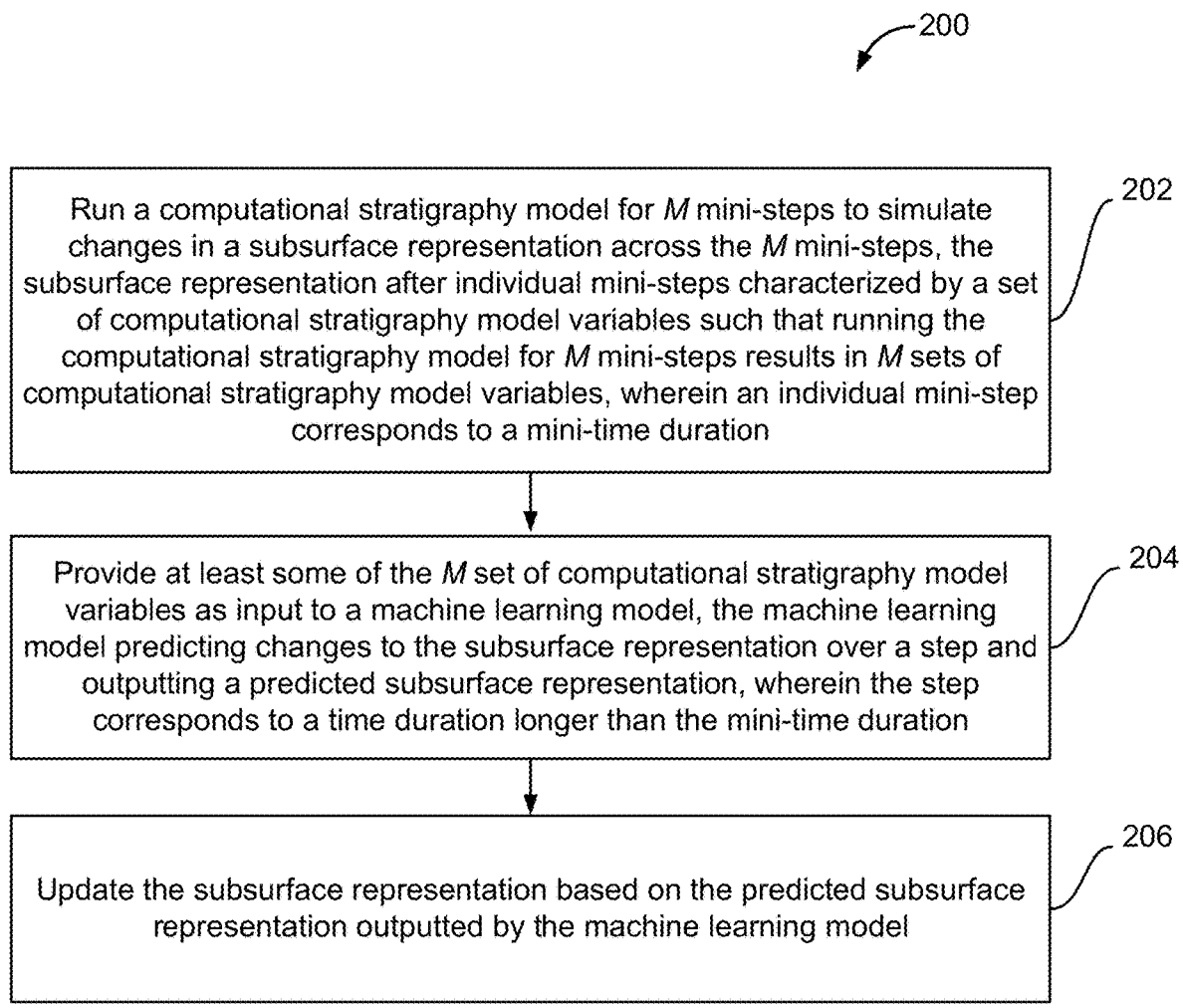
FIG. 2 illustrates an example method for accelerating computation of subsurface representations.

FIG. 2 illustrates method 200 for accelerated computation of subsurface representations. The operations of method 200 presented below are intended to be illustrative. In some implementations, method 200 may be accomplished with one or more additional operations not described, and/or without one or more of the operations discussed. In some implementations, two or more of the operations may occur substantially simultaneously.

In some implementations, method 200 may be implemented in one or more processing devices (e.g., a digital processor, an analog processor, a digital circuit designed to process information, a central processing unit, a graphics processing unit, a microcontroller, an analog circuit designed to process information, a state machine, and/or other mechanisms for electronically processing information). The one or more processing devices may include one or more devices executing some or all of the operations of method 200 in response to instructions stored electronically on one or more electronic storage media. The one or more processing devices may include one or more devices configured through hardware, firmware, and/or software to be specifically designed for execution of one or more of the operations of method 200.

Referring to FIG. 2 and method 200, at operation 202, a computational stratigraphy model may be run for M mini-steps to simulate changes in a subsurface representation across the M mini-steps, with a mini-step corresponding to a mini-time duration. The subsurface representation may change from 0-th subsurface representation to M-th subsurface representation. The subsurface representation after individual steps may be characterized by a set of computational stratigraphy model variables such that running the computational stratigraphy model for M mini-steps results in M sets of computational stratigraphy model variables. In some implementation, operation 202 may be performed by a processor component the same as or similar to the subsurface model component 102 (Shown in FIG. 1 and described herein).

At operation 204, at least some of the M sets of computational stratigraphy model variables from running of the computational stratigraphy model may be provided as input to a machine learning model. The machine learning model may predict changes to the subsurface representation over a step and output a predicted subsurface representation, wherein the step corresponds to a time duration longer than the mini-time duration. In some implementation, operation 204 may be performed by a processor component the same as or similar to the machine learning model component 104 (Shown in FIG. 1 and described herein).

At operation 206, the subsurface representation may be updated based on the predicted subsurface representation outputted by the machine learning model. In some implementation, operation 206 may be performed by a processor component the same as or similar to the update component 106 (Shown in FIG. 1 and described herein).

FIG. 7 is a block diagram illustrating an example stratigraphy system 700, in accordance with some embodiments. While certain specific features are illustrated, those skilled in the art will appreciate from the present disclosure that various other features have not been illustrated for the sake of brevity and so as not to obscure more pertinent aspects of the embodiments disclosed herein.

To that end, the computational stratigraphy system 700 includes one or more processing units (CPUs) 702, one or more network interfaces 708 and/or other communications interfaces 703, memory 706, and one or more communication buses 704 for interconnecting these and various other components. The computational stratigraphy system 700 also includes a user interface 705 (e.g., a display 705-1 and an input device 705-2). The communication buses 704 may include circuitry (sometimes called a chipset) that interconnects and controls communications between system components. Memory 706 includes high-speed random access memory, such as DRAM, SRAM, DDR RAM or other random access solid state memory devices; and may include non-volatile memory, such as one or more magnetic disk storage devices, optical disk storage devices, flash memory devices, or other non-volatile solid state storage devices. Memory 706 may optionally include one or more storage devices remotely located from the CPUs 702. Memory 706, including the non-volatile and volatile memory devices within memory 706, comprises a non-transitory computer readable storage medium and may store stratigraphy models.

In some embodiments, memory 706 or the non-transitory computer readable storage medium of memory 706 stores the following programs, modules and data structures, or a subset thereof including an operating system 716, a network communication module 718, and a stratigraphy module 720.

The operating system 716 includes procedures for handling various basic system services and for performing hardware dependent tasks.

The network communication module 718 facilitates communication with other devices via the communication network interfaces 708 (wired or wireless) and one or more communication networks, such as the Internet, other wide area networks, local area networks, metropolitan area networks, and so on.

In some embodiments, the stratigraphy module 720 executes the operations of the computational stratigraphy method. Stratigraphy module 720 may include data sub-module 725, which handles the intermediate computation results of the method. Data is supplied by data sub-module 725 to other sub-modules.

Training sub-module 722 contains a set of instructions 722-1 and accepts metadata and parameters 722-2 that will enable it to execute operations of the computational stratigraphy method related to training a machine learning algorithm. The modeling sub-module 723 contains a set of instructions 723-1 and accepts metadata and parameters 723-2 that will enable it to contribute to application of the trained machine learning based system to perform forward stratigraphic modeling. Although specific operations have been identified for the sub-modules discussed herein, this is not meant to be limiting. Each sub-module may be configured to execute operations identified as being a part of other sub-modules, and may contain other instructions, metadata, and parameters that allow it to execute other operations of use in processing seismic data and generate the seismic image. For example, any of the sub-modules may optionally be able to generate a display that would be sent to and shown on the user interface display 705-1. In addition, any of the data or processed data products may be transmitted via the communication interface(s) 703 or the network interface 708 and may be stored in memory 706.

The computational stratigraphy method is, optionally, governed by instructions that are stored in computer memory or a non-transitory computer readable storage medium (e.g., memory 706 in FIG. 1) and are executed by one or more processors (e.g., processors 702) of one or more computer systems. The computer readable storage medium may include a magnetic or optical disk storage device, solid state storage devices such as flash memory, or other non-volatile memory device or devices. The computer readable instructions stored on the computer readable storage medium may include one or more of: source code, assembly language code, object code, or another instruction format that is interpreted by one or more processors. In various embodiments, some operations in each method may be combined and/or the order of some operations may be changed from the order shown in the figures. For ease of explanation, the computational stratigraphy method is described as being performed by a computer system, although in some embodiments, various operations of the computational stratigraphy method are distributed across separate computer systems.

Although the system(s) and/or method(s) of this disclosure have been described in detail for the purpose of illustration based on what is currently considered to be the most practical and preferred implementations, it is to be understood that such detail is solely for that purpose and that the disclosure is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any implementation can be combined with one or more features of any other implementation.

What is claimed is:

1. A system for accelerated subsurface model computation, the system comprising:
one or more physical processors configured by machine-readable instructions to:
run a simulation of a subsurface region to generate different versions of a subsurface representation that represent the subsurface region at different times, the different versions of the subsurface representation including simulation of changes in the subsurface region with progression of time;
wherein:
the simulation of the subsurface region switches between use of a computational stratigraphy model and a machine learning model to generate the different versions of the subsurface representation;
the computational stratigraphy model uses time steps of a first size to simulate the changes in the subsurface region, the first size of the time steps used by the computational stratigraphy model constrained by a limitation to ensure stable computation of fluid flow by the computational stratigraphy model; and
the machine learning model uses time steps of a second size to simulate the changes in the subsurface region, the second size of the time steps used by the machine learning model not constrained by the limitation to ensure stable computation of fluid flow by the computational stratigraphy model, the second size of the time steps used by the machine learning model being greater than the first size of the time steps used by the computational stratigraphy model;
further wherein switching between the use of the computational stratigraphy model and the machine learning model to generate the different versions of the subsurface representations includes iterations of:
running the computational stratigraphy model for M mini-steps to generate versions of the subsurface representations that simulate the changes in the subsurface region with progress of time across the M mini-steps, individual versions of the subsurface representation after individual mini-steps characterized by a set of computational stratigraphy model variables such that running the computational stratigraphy model for M mini-steps results in generation of M versions of the subsurface representation and M sets of computational stratigraphy model variables corresponding to the M versions of the subsurface representation, wherein an individual mini-step corresponds to a mini-time duration of the first size constrained by the limitation to ensure stable computation of fluid flow by the computational stratigraphy model;
providing at least some of the M sets of computational stratigraphy model variables corresponding to the M versions of the subsurface representation as input to the machine learning model, the machine learning model predicting changes to the subsurface representation over a step and outputting a predicted version of the subsurface representation, wherein the step corresponds to a time duration of the second size longer than the mini-time duration that is not constrained by the limitation to ensure stable computation of fluid flow by the computational stratigraphy model; and
updating latest version of the subsurface representation based on the predicted version of the subsurface representation outputted by the machine learning model, wherein updating the latest version of the subsurface representation based on the predicted version of the subsurface representation results in the simulation of the subsurface region to jumping ahead in time by an amount that exceeds the limitation to ensure stable computation of fluid flow by the computational stratigraphy model.

2. The system of claim 1, wherein after the latest version of the subsurface representation is updated based on the predicted subsurface representation outputted by the machine learning model, the computational stratigraphy model is run for N mini-steps to simulate the changes in the subsurface region across the N mini-steps before a new iteration is run, N being larger than M.

3. The system of claim 1, wherein the set of computational stratigraphy model variables includes one or more of bottom topography, flow velocity field, flow depth, sediment concentration in flow, grain size composition, and/or sediment transport.

4. The system of claim 3, wherein the set of computational stratigraphy model variables further includes one or more morphodynamical variables.

5. The system of claim 1, wherein the machine learning model is trained by using one or more sets of computational stratigraphy model variables as training input to the machine learning model and by using the versions of the subsurface representation obtained from running of the computational stratigraphy model as truth to compare training output of the machine learning model.

6. The system of claim 5, wherein a window is used to define a training portion of the versions of the subsurface representation.

7. The system of claim 6, wherein multiple training data sets are generated based on different placements of the window within the versions of the subsurface representation.

8. The system of claim 1, wherein the changes to the subsurface representation predicted by the machine learning model include total topography change and partial topography change corresponding to individual grain size bin.

9. The system of claim 1, wherein:
the changes to the subsurface representation predicted by the machine learning model are compared with a vertical resolution; and
responsive to the changes to the subsurface representation predicted by the machine learning model exceeding the vertical resolution, a fraction of the changes predicted by the machine learning model is used to update the latest version of the subsurface representation.

10. The system of claim 1, wherein the limitation that constrains the first size of time steps to ensure stable computation of fluid flow by the computational stratigraphy model is determined based on Courant number.

11. A method for accelerated subsurface model computation, the method comprising:
running a simulation of a subsurface region to generate different versions of a subsurface representation that represent the subsurface region at different times the different versions of the subsurface representation including simulation of changes in the subsurface region with progression of time;
wherein:
the simulation of the subsurface region switches between use of a computational stratigraphy model and a machine learning model to generate the different versions of the subsurface representation;
the computational stratigraphy model uses time steps of a first size to simulate the changes in the subsurface region, the first size of the time steps used by the computational stratigraphy model constrained by a limitation to ensure stable computation of fluid flow by the computational stratigraphy model; and
the machine learning model uses time steps of a second size to simulate the changes in the subsurface region, the second size of the time steps used by the machine learning model not constrained by the limitation to ensure stable computation of fluid flow by the computational stratigraphy model, the second size of the time steps used by the machine learning model being greater than the first size of the time steps used by the computational stratigraphy model;
further wherein switching between the use of the computational stratigraphy model and the machine learning model to generate the different versions of the subsurface representations includes iterations of:
running the computational stratigraphy model for M mini-steps to generate versions of the subsurface representations that simulate the changes in the subsurface region with progress of time across the M mini-steps, individual versions of the subsurface representation after individual mini-steps characterized by a set of computational stratigraphy model variables such that running the computational stratigraphy model for M mini-steps results in generation of M versions of the subsurface representation and M sets of computational stratigraphy model variables corresponding to the M versions of the subsurface representation, wherein an individual mini-step corresponds to a mini-time duration of the first size constrained by the limitation to ensure stable computation of fluid flow by the computational stratigraphy model;
providing at least some of the M sets of computational stratigraphy model variables corresponding to the M versions of the subsurface representation as input to the machine learning model, the machine learning model predicting changes to the subsurface representation over a step and outputting a predicted version of the subsurface representation, wherein the step corresponds to a time duration of the second size longer than the mini-time duration that is not constrained by the limitation to ensure stable computation of fluid flow by the computational stratigraphy model; and
updating latest version of the subsurface representation based on the predicted version of the subsurface representation outputted by the machine learning model, wherein updating the latest version of the subsurface representation based on the predicted version of the subsurface representation results in the simulation of the subsurface region to jumping ahead in time by an amount that exceeds the limitation to ensure stable computation of fluid flow by the computational stratigraphy model.

12. The method of claim 11, wherein after the latest version of the subsurface representation is updated based on the predicted subsurface representation outputted by the machine learning model, the computational stratigraphy model is run for N mini-steps to simulate the changes in the subsurface region across the N mini steps, mini-steps before a new iteration is run, N being larger than M.

13. The method of claim 11, wherein the set of computational stratigraphy model variables includes one or more of bottom topography, flow velocity field, flow depth, sediment concentration in flow, grain size composition, and/or sediment transport.

14. The method of claim 13, wherein the set of computational stratigraphy model variables further includes one or more morphodynamical variables.

15. The method of claim 11, wherein the machine learning model is trained by using one or more sets of computational stratigraphy model variables as training input to the machine learning model and by using the versions of the subsurface representation obtained from running of the computational stratigraphy model as truth to compare training output of the machine learning model.

16. The method of claim 15, wherein a window is used to define a training portion of the versions of the subsurface representation.

17. The method of claim 16, wherein multiple training data sets are generated based on different placements of the window within the versions of the subsurface representation.

18. The method of claim 11, wherein the changes to the subsurface representation predicted by the machine learning model include total topography change and partial topography change corresponding to individual grain size bin.

19. The method of claim 11, wherein:
the changes to the subsurface representation predicted by the machine learning model are compared with a vertical resolution; and
responsive to the changes to the subsurface representation predicted by the machine learning model exceeding the vertical resolution, a fraction of the changes predicted by the machine learning model is used to update the latest version of the subsurface representation.

20. The method of claim 11, wherein the limitation that constrains the first size of time steps to ensure stable computation of fluid flow by the computational stratigraphy model is determined based on Courant number.

* * * * *

UNITED STATES PATENT AND TRADEMARK OFFICE
CERTIFICATE OF CORRECTION

| | |
|---|---|
| PATENT NO. | : 11,604,909 B2 |
| APPLICATION NO. | : 16/706596 |
| DATED | : March 14, 2023 |
| INVENTOR(S) | : Tao Sun et al. |

It is certified that error appears in the above-identified patent and that said Letters Patent is hereby corrected as shown below:

In the Claims

In Claim 20, Column 23, Line 27, please delete "daim" and insert --claim--, therefor.

Signed and Sealed this
Twenty-third Day of May, 2023

Katherine Kelly Vidal
*Director of the United States Patent and Trademark Office*